United States Patent
Beaumier et al.

(10) Patent No.: US 10,043,725 B2
(45) Date of Patent: Aug. 7, 2018

(54) FLIP CHIP BALL GRID ARRAY WITH LOW IMPEDENCE AND GROUNDED LID

(71) Applicant: International Business Machines Corporation, Armonk, NY (US)

(72) Inventors: Martin Beaumier, Granby (CN); Yves Dallaire, Lac-Brome (CN); Melania C. Doll, Armonk, NY (US); Michael Gaynes, Armonk, NY (US); Edward J. Yarmchuk, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/655,590

(22) Filed: Jul. 20, 2017

(65) Prior Publication Data

US 2018/0090406 A1 Mar. 29, 2018

Related U.S. Application Data

(63) Continuation of application No. 15/275,248, filed on Sep. 23, 2016, now Pat. No. 9,786,572.

(51) Int. Cl.
| | |
|---|---|
| *H01L 21/50* | (2006.01) |
| *H01L 23/10* | (2006.01) |
| *H01L 23/373* | (2006.01) |
| *H01L 23/498* | (2006.01) |
| *H01L 23/04* | (2006.01) |
| *H01L 23/552* | (2006.01) |
| *H01L 23/433* | (2006.01) |
| *H01L 23/06* | (2006.01) |

(52) U.S. Cl.
CPC .............. *H01L 23/10* (2013.01); *H01L 23/04* (2013.01); *H01L 23/06* (2013.01); *H01L 23/3736* (2013.01); *H01L 23/433* (2013.01); *H01L 23/49816* (2013.01); *H01L 23/552* (2013.01)

(58) Field of Classification Search
CPC ....... H01L 23/552; H01L 23/04; H01L 23/06; H01L 23/3736; H01L 23/433; H01L 23/49816
USPC .......................................... 438/122
See application file for complete search history.

(56) References Cited

U.S. PATENT DOCUMENTS

| | | | |
|---|---|---|---|
| 6,063,999 A * | 5/2000 | Kelly ................... | H05K 9/0028 174/351 |
| 7,573,709 B2 * | 8/2009 | Gilliland ............... | H01L 23/552 174/252 |

* cited by examiner

*Primary Examiner* — Luan C Thai

(57) ABSTRACT

A contact spring for placement in a gap between an electrical substrate opposite a lid (electrically conductive heat spreader) of an electronic device comprises a spring that both conducts heat from the substrate to the lid and electrically connects the substrate and lid. The spring comprises a flat single element configured as a plurality of polygons, providing contact points, the spring substantially lying in a plane and extending substantially in a straight line, or a spiral. The spring in an electronic device such as a flip chip ball grid array having this lid and an electrical substrate with EMI emitters: (1) provides low impedance electrical connection between the electronic circuit and lid; (2) grounds the lid to the electronic circuit; (3) minimizes EMI in the electronic circuit; (4) conducts heat from the electronic circuit to the lid; or any one or combination of the foregoing features (1)-(4).

42 Claims, 5 Drawing Sheets

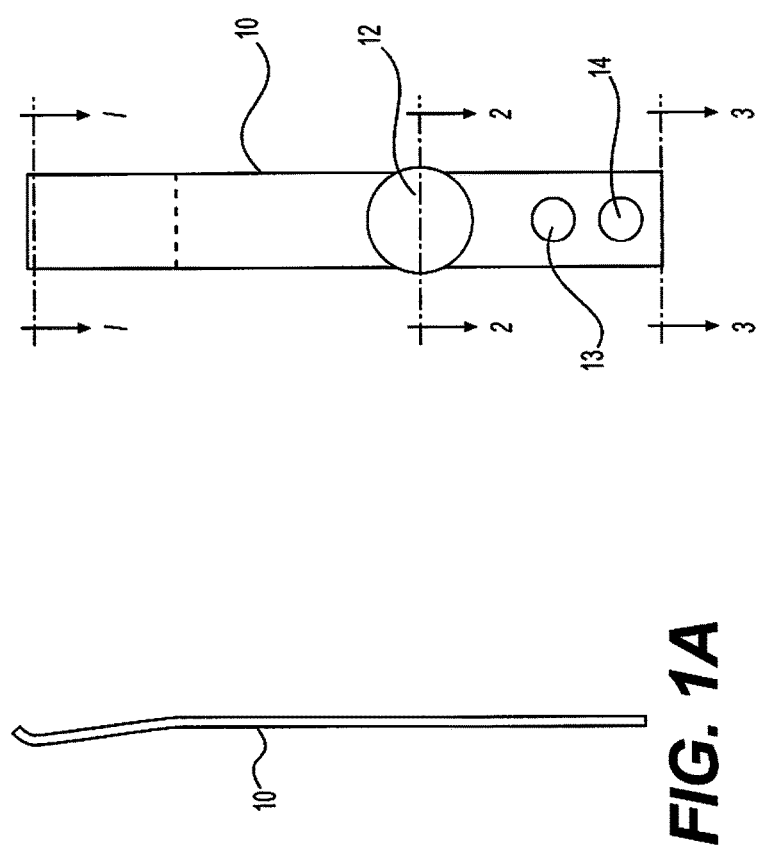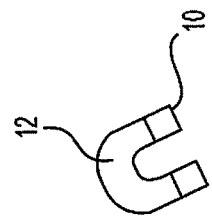

FLIP CHIP BALL GRID ARRAY WITH LOW IMPEDENCE AND GROUNDED LID

This application is a continuation of parent application Ser. No. 15/275,248 Filed Sep. 23, 2016 which is incorporated herein by reference in its entirety. Applicants claim all benefits of this parent application pursuant to 35 USC § 120.

FIELD OF THE INVENTION

The field of the invention comprises, inter alia, a flip chip ball grid array (FCBGA) with low impedance and a grounded lid.

BACKGROUND OF THE INVENTION

Semiconductor packages are becoming stronger EMI (electromagnetic interference) emitters within an electronic system because chip operating frequencies and power are increasing. In order to ensure compliance to international standards for EMC (electromagnetic compatibility), system designers must work with electronic packaging designers of the various subsystems: power supplies, motors, cable interconnection, printed circuit board and chip modules. These several designers must identify the strong
EMI emitters and proactively apply EMI mitigation practices. One area of increasing focus is the high speed, highly integrated semiconductor package. On chip currents and voltages create magnetic and electric fields that travel through free space. These stray electro magnetic (EM) fields can adversely interact with other assemblies within the system and also, can leak through system cabinet seams, openings and vents. EM emissions from chips can be intercepted by an electrically conductive the heat spreader or lid that is typically adhesively bonded directly to the back side of a flip chip and the heat spreader is electrically grounded.

One practice has been to use metal clips that are installed on the finished module or after the module has been attached to a printed circuit card or board. The clip electrically and mechanically links the electrically conductive heat spreader to a ground pad either on the chip substrate or directly to the card, i.e., the chip package. Clip installation is difficult to automate and also has the potential to create metal debris from scraping. Since the clips protrude beyond the standardized physical outline of the package, forethought might be required during the card or board design to allow extra space for installation. A more preferred grounding solution is one that can be easily incorporated during the chip package manufacturing. Solder interconnection has been evaluated and found to be sensitive to fatigue cracking. Solder connects the underside of the electrically conductive heat spreader to ground pads on the substrate.

These connections are short in length and exposed to package shear and tensile cyclic stresses from heating and cooling that eventually result in cracked solder joints. An alternative to solder is electrically conductive adhesive (ECA) joining which provides a more strain/stress tolerant connection. However, ECAs require noble metal finishes for low contact resistance that is stable through environmental stress. Non noble finishes such as nickel and copper might provide low contact resistance just after bonding but are subject to continued oxidation and hydration that leads to high resistances in the several ohm range. Further, ECA cure chemistry has been known to adversely interfere with the cure chemistry of sealband adhesives that are used to bond the electrically conductive heat spreader to the substrate. ECA joints are vulnerable to degradation during impact shock loading.

RELATED ART

The following references relate to the state of the art in the field of the invention:
United States Patent and Patent Applications, U.S. Pat. No. 3,747,044; 20140378008; 20100279558; U.S. Pat. Nos. 8,363,411; 7,999,202; 7,914,351; 6,744,269;
Chinese; CN205248253U; CN104684329A;
German; DE202015105765U1; DE102008045615B4;
Japanese JP2014225571A.

SUMMARY OF THE INVENTION

The present invention provides structures, articles of manufacture and processes that address these needs, and products produced by these processes that not only provide advantages over the related art, but also to substantially obviate one or more of the foregoing and other limitations and disadvantages of the related art. Not only do the written description, claims, abstract of the disclosure, and the drawings, that follow set forth various features, objectives and advantages of the invention and how they may be realized and obtained, but these features, objectives and advantages of the invention will also become apparent by practicing the invention.

To achieve these and other advantages, and in accordance with the purpose of the invention as embodied and broadly described herein, the invention comprises the use of an electrical contact spring in the gap between a lid also referred to as a electrically conductive heat spreader and an electronic device substrate, i.e., electrical substrate, such as a flip chip substrate. A contact spring is a continuous, fatigue resistant metal such as BeCu that has compliance to accommodate shear and tensile package stresses. The contact spring has a plurality of device contacts in the body of the spring where the device contacts extend from one side edge of the spring or one surface of the spring, or both the side edge and the surface, the device contacts being arranged so that they are operatively associated with the electrically conductive heat spreader and the electrical substrate, e.g., at least one device contact point can abut up against the electrically conductive heat spreader and at least one device contact point can abut up against the electrical substrate. In the embodiment where we configure the contact spring as a flat oblong, it will have more than one device contact along its length.

The contact spring can be soldered, mechanically loaded, or adhesively joined to the device, or used in any combination of these processes, all of which comprise a way to operatively associate the electrical contact spring in the gap of the device with the lid and the substrate to obtain heat conductance from the substrate to the lid, EMI reduction, a grounded lid and low impedance in the electronic device.

The contact spring for placement in a gap between an electrical substrate juxtaposed opposite a lid or electrically conductive heat spreader of an electronic device comprises a spring that both conducts heat from the substrate to the lid and electrically connects the substrate and lid through device contacts on the spring. The spring in this respect is operatively associated with the lid and the electrical substrate. The spring comprises a flat single element but configured as a plurality of polygons, to provide one or multiple device contacts, the spring substantially lying in a plane and extending substantially in a straight line, or a spiral.

In another embodiment, placing the spring this way in an electronic device such as a flip chip ball grid array having a lid (electrically conductive heat spreader) and an electrical substrate that includes EMI emitters: (1) provides a low impedance electrical connection between the electrical substrate and the lid; (2) grounds the lid to the electrical substrate; (3) minimizes EMI in the electrical substrate; (4) conducts heat from the electrical substrate to the lid, or any one or combination of the foregoing properties (1)-(4). Additionally, placing the spring in this way in an electronic device to obtain any one or combination of the foregoing properties, also produces an article of manufacture in which the spring is operatively associated with the lid and the electrical substrate.

BRIEF DESCRIPTION OF THE DRAWINGS

The accompanying drawings are not necessarily drawn to scale but nonetheless set out the invention, and are included to illustrate various embodiments of the invention, and together with this specification also serve to explain the objects, advantages, and principles of the invention. The drawings comprise:

FIG. 1A comprises a side elevation in cross-section of a planar or leaf spring of this invention;

FIG. 1B comprises a plan view of a planar or leaf spring of this invention;

FIG. 1C comprises an end elevation taken along line 3-3 of FIG. 1B;

FIG. 1D comprises an end elevation taken along line 1-1 of FIG. 1A and FIG. 1B;

FIG. 1E comprises a partial cross-section taken along line 2-2 of FIG. 1B;

DETAILED DESCRIPTION

Figure 2:
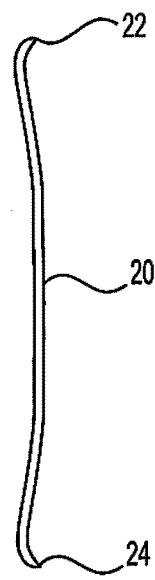
FIG. 2 comprises a side elevation in cross-section of a planar or leaf spring of this invention.

To achieve these and other advantages, and in accordance with the purpose of this invention as embodied and broadly described herein, the following detailed embodiments comprise disclosed examples that can be embodied in various forms. The specific processes and structural details set out comprise a basis for the claims and a basis for teaching one skilled in the art to employ the present invention in any novel and useful way. The terms, phrases and Figures also set out herein provide a description of how to make and use this invention. One having ordinary skill in the relevant art, once aware of the present disclosure, could employ suitable processes and structures without undue experimentation.

In one aspect, the invention comprises a spring design concept shown in the various FIGS., described above. The spring typically is longer than it is wide, e.g., having anywhere from about 2 to about 50 times its width, about 2 to about 40 times its width, about 2 to about 20 times its width, or from about 2 to about 10 times its width and the like.

FIG. 1A, as noted, comprises a side elevation in cross-section of a planar or leaf spring 10 of this invention made from an alloy BeCu optionally plated with a metal such as Sn, e.g., by an immersion tin coating process known in the art, or any of the noble metals such as Au, Pt, Ir, Os, and Re. One end of spring 10 bends away from the body of the spring and turns downward at the end of the bend to form a contact edge shown in the FIG. 1D head on view or end elevation taken along line 1-1 of FIG. 1A and FIG. 1B. FIG. 1D also shows spring 10 in one embodiment as an arced planar element, i. e., spring 10 is arced along its width, as also shown in FIG. 1C, an end elevation taken along line 3-3 of FIG. 1B. FIG. 1B comprises a plan view of spring 10, and also illustrates a dimple 12 extending outwardly from spring 10, as well as perforations 13 and 14 on spring 10. FIG. In another embodiment, not illustrated, spring 10 may have up to about five, or up to about ten dimples like dimple 12. We consider the surface of the spring 10 at the base of dimple 12 as it extends outwardly and away from the base of dimple 12 as a second device contact, and dimple 12 as a first device contact so that the surface of spring 10 at this point has more than one contact point. 1E comprises a side elevation in cross-section taken along the line 2-2 of FIG. 1B illustrating the projection of dimple 12 outwardly from the surface of spring 10. The flexibility of spring 510 allows it to be bent substantially up to about 180° so that it may be operatively associated with groove 523 in lid 516.

Figure 3:
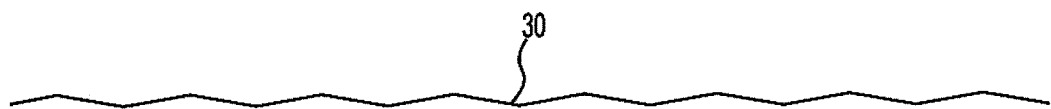
FIG. 3 comprises a side elevation in cross-section of a planar or leaf spring of this invention.

In FIG. 2, and FIG. 3 we illustrate a side elevation in cross-section of a planar or leaf spring 20 or 30 of this invention, fabricated of the same material of, and optionally plated in the same way as spring 10. In both FIG. 2 and FIG. 3 we provide multiple ground connection points to reduce inductance. The spring 20 can be formed so that both ends have contact tips 22 and 24 pointing away from spring 20, or multiple device contacts as shown in FIG. 3 that illustrates mild bends in the spring 30 to have as many device contacts as needed. FIG. 3 in this regard depicts eight upper device contacts and nine lower device contacts pitched at 0.125 inches along a one inch length. The bending shown here is a series of kinks forming line-type device contacts across the width of the strip.

Figure 4:
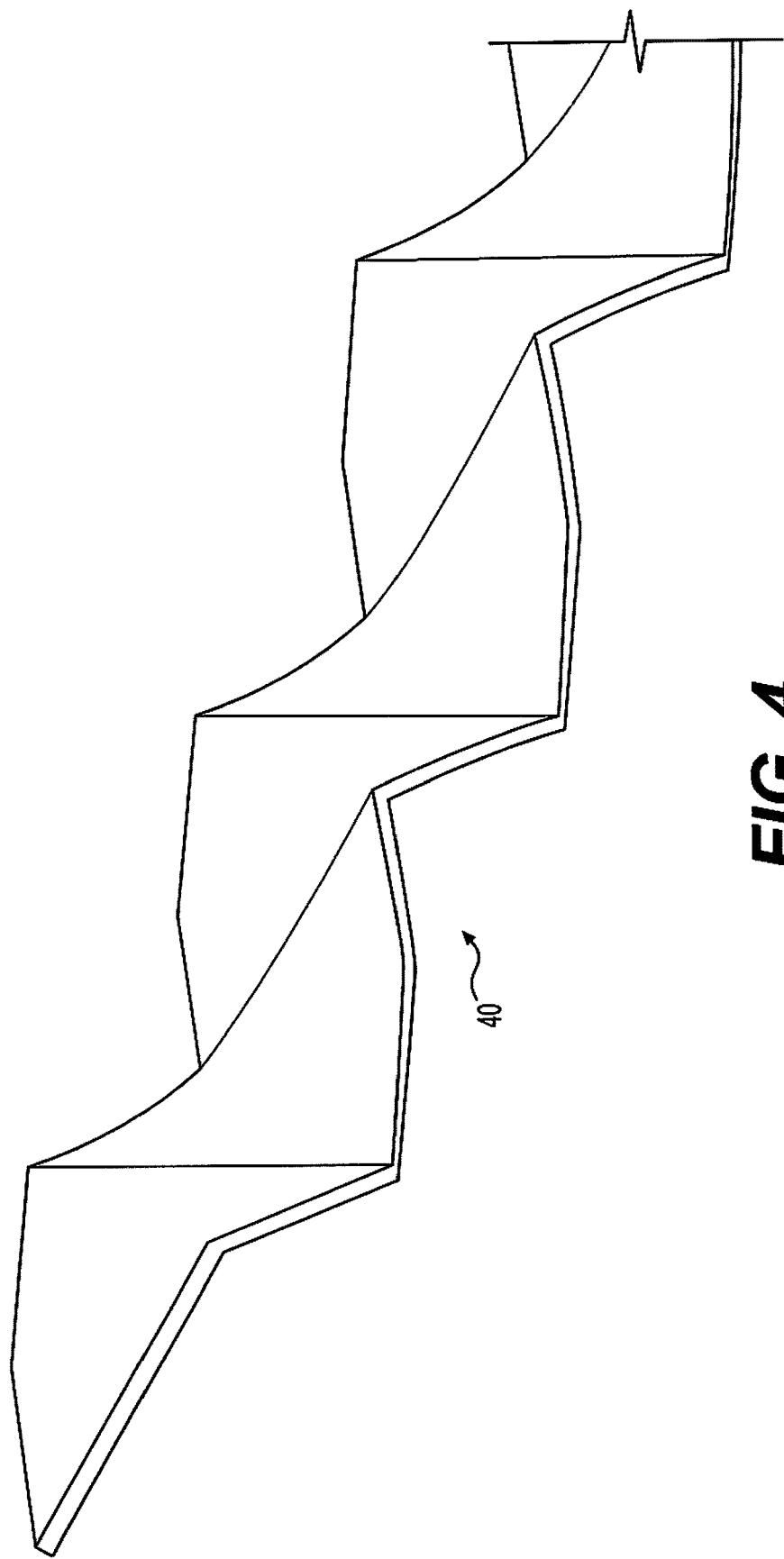
FIG. 4 comprises a perspective view of a type of planar or leaf spring of this invention.

Another embodiment of the invention comprises the bends in spring 40 illustrated in FIG. 4 comprising twists of the spring into bow tie shapes along the length of the strip thereby providing multiple contacts at smaller regions along the side edges of the strip. Yet another embodiment would be cone shaped, split washer springs 660 (Belleville-like springs as disclosed herein, with an embodiment illustrated in FIGS. 6D and 6E)) placed at intervals along the seal band 517A (not illustrated).

Figure 5:
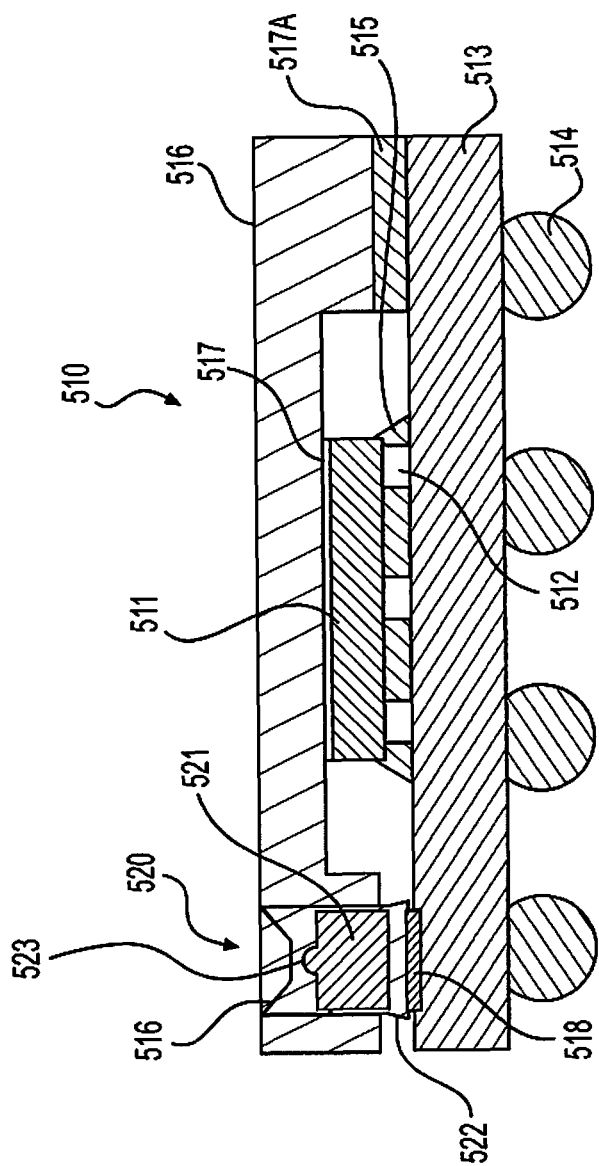
FIG. 5 comprises a side elevation in cross-section of a planar or leaf spring of this invention operatively associated with an electronic device having a substrate and electrically conductive heat spreader.

FIG. 5 comprises a side elevation in cross-section of a planar or leaf spring of this invention operatively associated with an electronic device having a substrate and electrically conductive heat spreader. FIG. 5, illustrates a typical flip chip electronic ball grid array (FCPBGA) package 510 that includes Chip 511 having a plurality of solder bumps 512 for connecting to corresponding pads (not shown) on a surface of substrate 513. Solder balls 514 are provided on the underside of substrate 513 in order to attach the package to other circuitry on a substrate or circuit board. Chip 511 is electrically connected by means of the chip solder bumps 512 and conductive circuitry through substrate 513 to solder balls 514 in a well known manner. Chip 511 is sealed to substrate 513 by underfill 515 and optionally other encapsulating material known in the art. Cover plate or lid 516 (which also functions as a electrically conductive heat spreader, and which may be constructed from Cu) extends outwardly over a gap that contains contact spring 521, flexed from a substantially flat configuration to any where from about 10° to about 180°, and is attached to the upper surface of chip 511 as shown, by means of thermally conductive adhesive 517. Typically, a first adhesive 517 is applied to the upper surface of chip 511, and a second adhesive 517A (i.e., a seal band) is applied on the upper surface of the substrate 513 at its perimeter. Lid 516 is placed thereon and the adhesive subsequently cured. Lid 516 provides physical protection for chip 511 and also in conjunction with the thermally conductive adhesive 517 acts as an electrically conductive heat spreader to dissipate unwanted heat that is generated by the electronic device or chip 511. Good thermal conductivity between chip 511 and lid 516 requires adhesive 517 to be in the form of a relatively thin and uniform adhesive bond line between lid 516 and chip 511.

Ground pad 518 as shown, for example, on the upper surface of substrate 513, is electrically connected to ground potential as by circuitry through substrate 513 to one or more solder balls 514, as is well known.

The existence of one or more openings 520 in lid or cover 516 provides for various forms of electrical and physical connections between lid 516 and ground pad 518. According to one embodiment of the present invention we provide the electronic package 510 with a more compliant connection between lid 516 and one or more ground pads 518 than what is achievable with a fixed adhesive or solder connection as previously described. We place contact spring 521 of the present invention in a gap between electrically conductive heat spreader 516 and substrate 513 which comprises an electrical substrate as shown in FIG. 5.

Contact spring 521 of the present invention comprises a flat single element but configured as a plurality of polygons joined to one another one edge to one edge to form a pattern of repeating polygons substantially lying in a plane and extending substantially in a straight line, the length of the contact spring being greater than its width. We also refer to contact spring 521 as a leaf spring, but also configure it as a spiral connector. We fabricate contact spring 521 out of spring materials such as Be/Cu that may be coated with tin, e.g., by means of a tin immersion coating or tin electroplating, or a coating comprising a precious metal such as gold.

These polygons comprise three or four sided polygons or polygons having up to about ten or more sides where the polygons having three, five or a greater number of sides provide multiple device contacts along one or both of the side edges (i.e., the non-joined polygon edges) of the contact spring. These polygons comprise triangles, squares, any other parallelograms, e.g., rectangles, as well as trapezoids, rhombi, pentagons, hexagons, septagons, octagons or any other polygons having up to about ten sides, or more and the like known in the art. FIG. 1A illustrates a configuration of the spring that projects the joining of squares edge to edge in substantially a straight line, whereas FIG. 4 illustrates a configuration of the spring that projects the joining of polygons, i.e., squares and triangles edge to edge to provide multiple device contacts along at least one of the side edges (i.e., the non-joined edges) of the spring as it projects in substantially a straight line from the first of the polygons to the last of the polygons.

We place contact spring 521 in opening 520 of lid 516 where the opening 520 has been designed to be physically located proximate to the area of the corresponding ground pad 518 on substrate 513 during the attachment of lid 516 to chip 511. By providing contact spring 521 with pre-soldered regions at each extremity thereof, contact spring 521 can be readily soldered to either lid 516 or ground pad 518 or both as shown by connectors 522 (e.g., solder connectors) during the subsequent solder flow process of attaching solder balls 514 to the substrate 513 or circuit board. The attachment of spring contact 521 in this manner maintains compliance between the two connectors 522. With the approach as described for this aspect of the embodiment of the invention, minimal pre-alignment, pre-placing or pre-solder attachment is required between contact spring 521 and lid 516. In addition, no pressure is required to be applied between lid 516 and substrate 513 to ensure contact spring 521 appropriately contacts lid 516 and ground pad 518 during the attachment of lid 516 to chip 511 since the placement of contact spring 521 and the soldering of contact spring 521 to lid 516 and ground pad 518 is achieved subsequent to and separate from the process of attachment of cover 516 to chip 511. Furthermore, there is no adverse requirement, for example, to blindly align contact spring 521 to ground pad 518 from the bottom surface of cover 516 as the connection is visible from the top of opening 520.

Connectors 522 may comprise electrical conductor and heat conductor, i.e., electrically conductive heat spreader materials such as metal connectors extending from and operatively associated with ground pad 518. Connectors 522 include solder connectors In one embodiment where contact spring 521 of the present invention comprises a leaf spring that has been dimpled with dimple 12, we provide groove 523 in lid 516 that is arranged to conductively engage dimple 12, i.e., electrically and/or thermally engage dimple 12, and improve electrical connectivity and heat conductivity of contact spring 521 with lid 516, connectors 522, solder bumps 512, substrate 513, underfill 515, and chip 511.

Figure 6A:
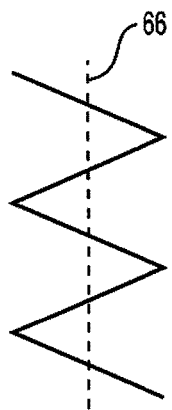
FIGS. 6A, 6B, 6C, and 6D, comprise side elevations in cross-section of the planar spring of the present invention configured to spiral around an axis fixed in space.
Figure 6B:
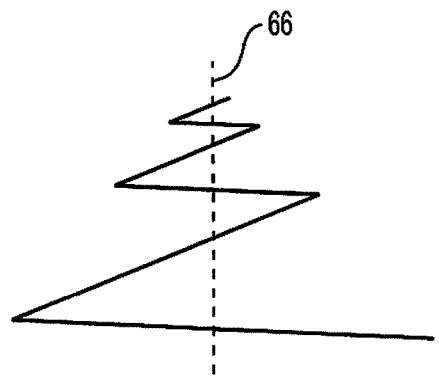
Figure 6C:
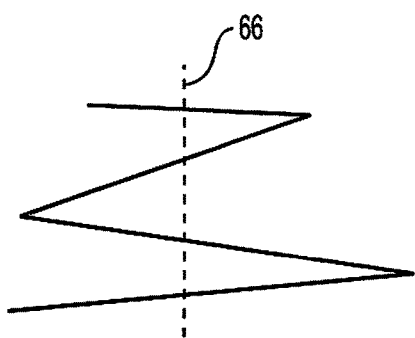
Figure 6D:
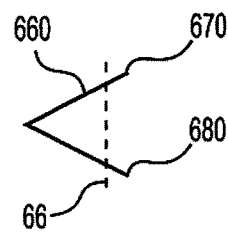

FIGS. 6A, 6B, 6C, 6D, and 6E comprise side elevations in cross-section of the planar spring of the present invention shown in FIGS. 1A, 1B, 2, 3, and 4, configured to spiral around an axis 66 fixed in space. FIG. 6A comprises a tubular configuration, FIG. 6B, a conical configuration, and FIG. 6C, a frusto-conical configuration.

Figure 6E:
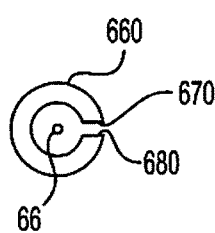
FIG. 6E comprise a plan view of the spring of FIG. 6D.

FIG. 6E comprises a side elevation in cross-section of a planar spring 660, configured after the spring of FIG. 1A spiraling around an axis 66 fixed in space to form a split washer, a Belleville-like washer, where the plane of the spring only spirals about one time around axis 66 by about 360° and the plane of the spring terminates in ends 670 and 680.

FIG. 6F comprises a plan view of the article illustrated in FIG. 6E.

In another embodiment planar spring 660 may be configured to spiral around an axis fixed in space to form a split Belleville-like washer where the plane spirals around an axis fixed in space a number of degrees comprising about 340° to about 380°.

In use, the spring 10 as illustrated in FIG. 1A to FIG. 1 E having a low profile that allows it to work in the typically practiced sealband bondline space, and typically about two to about five mm wide and about 0.15 mm to about to about 0.3 mm tall (about 0.006 inches to about 0.012 inches). The spring 10 is press fit into a groove or slot 523 of the device shown in FIG. 5 that is machined into the lid or electrically conductive heat spreader 516. A dimple 12 is formed on the spring 10. When pressed into the heat spreader groove 523 with about <10 lbs, the chord length decreases allowing insertion and scraping between a tangent on the dimple and the sidewall of the groove 523. The dimple 12 is mechanically locked into the groove 523 and provides a contact resistance. The contact shaft which can be narrower (not shown) than the press fitted dimple 12 is recessed into the groove 523 and thus, is not in the sealband bondline space. The dimple can be positioned along the shaft to define low deflection forces (25-125 grams) for the contact tips (line 1-1 and line 3-3 of FIG. 1B) which also has a hemispherical dimple (FIG. 1D) that lands on the ground ring of the chip carrier during heat spreader attachment. There are several options for treating the contact tips. Contact spring 10, when made of BeCu, the easiest option is to do nothing to the BeCu surface or to have it pretreated with a copper passivation such a benzotriazole. Typically, a ground pad 518 on the carrier 513 will be covered with solder. During the normal manufacturing solder reflows, subsequent to lid 516 attach, the solder alloy on the pad will reflow and metallurgically wet the BeCu spring. Alternatively, the contact tips (line 1-1 and/or line 3-3 of FIG. 1B) can be plated with Sn e.g., by immersion coating, or a lead free alloy which will facilitate metallurgical joining to the carrier ground pad during reflow to ensure a low and stable contact resistance connection. Lastly, noble metal plating can be used at both the contact tip and carrier pad.

In the process sequence for heat spreader attachment, we would form grove 523 in the lid or electrically conductive heat spreader 516 before plating with Ni whereas the current process can also involve Ni plating without forming groove 523. We would then insert springs 10 into the groove 523 in a manner previously described and the lid 516 would be ready to be combined with the device 510. By contrast, in the existing process steps, the sealband adhesive is dispensed on the chip carrier leaving openings around the ground pads to which springs are placed to make contact with the chip carrier, the lid is placed on the resultant assembly, a mating force applied, the structure is locked and the cured.

Another embodiment comprises the bends in spring 40 illustrated in FIG. 4 comprising twists of the spring into bow tie shapes along the length of the strip thereby providing multiple contacts at smaller regions along the side edges of the strip. Yet another embodiment would be cone shaped washer springs (e.g., Belleville-like springs, 600 illustrated in FIGS. 6-D, 6-E or cone shaped springs FIGS. 6B, 6C) placed at intervals along the seal band.

With these concepts, it is possible to eliminate the heat spreader grooving. A portion of the seal band adhesive would be dispensed in lines, line segments or dots. After placing the strips along each edge of the carrier 513 and into the sealband adhesive, more sealband adhesive is dispensed to primarily fill the valley bends shown in FIG. 3. An alternative is to punch holes in the strip length that allow the initial deposit of adhesive to pass through. Next, place a plan-of-record lid and cure under force. The peaks and valleys of the bends will push through the adhesive and contact the lid and ground pads for metal-to-metal contact. Similar structures have been prototyped and yield low and stable contact resistance (<20 milliohms) through environmental stress that would be more than adequate to meet the requirements defined by OEM.

Various embodiments of our invention also comprise inter alia a process for manufacturing an article of manufacture comprising placing a contact spring for placement in a gap between a electrically conductive heat spreader and an electrical substrate, the heat spreader positioned to remove heat from the electrical substrate, the spring being structured to both conduct heat from the substrate to the heat spreader and to electrically connect the substrate and heat spreader, the spring comprising a flat single element but configured as a plurality of polygons joined to one another, one edge of one polygon to one edge of a contiguous polygon to form a pattern of repeating polygons substantially lying in a plane and extending substantially in a straight line, the length of the contact spring being greater than its width, the contact spring comprising one or multiple device contacts that extend at least from one side edge of the spring, or greater than three device contacts that extend from at least one surface of the spring, the device contacts arranged so that the spring comprises at least one device contact that abuts up against the heat spreader and at least one device contact that abuts up against the electrical substrate. In further embodiments, each of the polygons may have the same number of sides, e.g., from three to about four sides; the plane may project forwardly along its length, and then at one interval or a plurality of intervals along its length, extends upwardly for a fixed number of degrees and subsequently downwardly for about the same number of degrees to form the device contacts and the plane continues to project forwardly along its length; at least one of the intervals may be separated by the plane that continues to project forwardly along its length; the plane may be arced along its length to form one of the device contacts; the plane may be dimpled to form at least one of the device contacts, the dimple conductively engaging a groove in at least one of the electrically conductive heat spreader or electrical substrate to provide a heat conductive contact and electrical contact between the article, the electrically conductive heat spreader, and the electrical substrate; one or both ends of the plane may be angled away from the plane to form the device contacts; both ends of the plane may be angled away from the plane in the same direction; the plane may have an arced cross section.

The foregoing process may also comprise forming said contact spring to comprise a combination of different polygons arranged to provide several of the device contacts along at least one of the non-joined side edges of the polygons and functioning as the device contacts as the spring projects forward from the first of the polygons to the last of the polygons, and in one further embodiment may be substantially as shown in FIG. 4; and in another embodiment, the plane is optionally perforated.

Various other embodiments of our invention also comprise inter alia a process for producing an article of manufacture comprising placing a contact spring in a gap between an electrically conductive heat spreader and an electrical substrate, the heat spreader positioned to remove heat from the electrical substrate, the spring being structured to both conduct heat from the substrate to the heat spreader and to electrically connect the substrate and heat spreader, the spring comprising a flat single element but configured as a plurality of polygons joined to one another, one edge of one polygon to one edge of a contiguous polygon to form a pattern of repeating polygons substantially lying in a plane that spirals around an axis fixed in space, the length of the contact spring being greater than its width, the contact spring having multiple device contacts in the body of the spring where the device contacts extend from one side edge of the spring or one surface of the spring, or both the side edge and the surface, the device contacts arranged so that at least one abuts up against the heat spreader and at least one can abut up against the electrical substrate. In further embodiments each of the polygons may have the same number of sides; each of the polygons may have from three to about four sides; the polygons may have from three to about four sides; the plane projects forwardly along its length, and then at one interval or a plurality of intervals along its length, extends upwardly for a fixed number of degrees and subsequently downwardly for about the same number of degrees to form the device contacts and the plane continues to project forwardly along its length; at least one of the intervals may be separated by the plane that continues to project forwardly along its length; one or both ends of the plane may be angled away from the plane to form the device contacts; both ends of the plane may be angled away from the plane in the same direction; the plane in profile may spiral around an axis fixed in space to form a tubular shape; the plane in profile may spiral around an axis fixed in space to form a frusto-conical shape; the plane may have an arced cross section; the repeating polygons that extend upwardly and downwardly around the axis fixed in space may have an inner edge facing the axis and an outer edge facing away from the axis, and the inner edge and the outer edge are rounded toward the axis; the article of manufacture may be configured as a split washer where the plane only spirals about once around the axis; the article of manufacture may be configured as a split washer where the plane spirals around the axis by about 340° to about 380°;

Various embodiments of our invention as set out in paragraph [0030.3] also comprise inter alia a process for manufacturing an article of manufacture where the contact spring that may be positioned in an electronic device having an electronic circuit that includes EMI emitters, the electronic device also including a lid comprising a substantially juxtaposed electrically conductive heat spreader, the contact spring operatively associated with the electronic circuit to at least: (1) provide a low impedance electrical connection between the electronic circuit and the lid; (2) ground the lid to the electronic circuit; (3) minimize EMI in the electronic circuit; (4) conduct heat from the electronic circuit to the lid; or any one or combination of the features (1), (2), (3), (4); the electronic device may comprise a flip chip ball grid array; each of the polygons may have the same number of sides; each of the polygons may have from three to about four sides; the plane may project forwardly along its length, and then at one or a plurality of intervals along its length, extends upwardly for a fixed number of degrees and subsequently downwardly for about the same number of degrees and the plane continues to project forwardly along its length; at least one of the intervals may be separated by the plane that continues to project forwardly along its length; the plane may be dimpled to form at least one of the device contacts, the dimple arranged to conductively engage a groove in at least one of the electrically conductive heat spreader or electrical substrate to provide a heat conductive contact and electrical contact between the article, the heat spreader, and the electrical substrate; one or both ends of the plane may be angled away from the plane to form the device contacts; both ends of the plane may be angled away from the plane in the same direction; the plane may have an arced cross section; the article of manufacture may comprise a combination of different polygons arranged to provide several of the device contacts along at least one of the non-joined side edges of the polygons to act as the device contacts as the spring projects in substantially a straight line from the first of the polygons to the last of the polygons; the spring may be configured substantially as shown in FIG. 4; the plane may be optionally perforated.

Throughout this specification, abstract of the disclosure, claims, and in the drawings the inventors have set out equivalents, including without limitation, equivalent elements, materials, compounds, compositions, conditions, processes, structures, and even though set out individually, also include combinations of these equivalents such as the two component, three component, or four component combinations, or more as well as combinations of such equivalent elements, materials, compounds, compositions conditions, processes, structures in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters in this written description, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, 15 per-cent, or 20 percent, or somewhat higher or lower than the upper limit of five per-cent, ten per-cent, 15 per-cent, or 20 per-cent. The term "up to" that defines numerical parameters means a lower limit comprising zero or a miniscule number, e.g., 0.001.

The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, and if not specifically stated herein, the written description, specification, claims, drawings, and abstract of the disclosure as subsequently amended.

All scientific journal articles and other articles, including internet sites, as well as issued and pending patents that this written description mentions including the references cited in such scientific journal articles and other articles, including Internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A process for manufacturing a device comprising placing a contact spring in a gap between a electrically conductive heat spreader and an electrical substrate, said heat spreader positioned to remove heat from said electrical substrate, said spring being structured to both conduct heat from said substrate to said heat spreader and to electrically connect said substrate and heat spreader, said spring comprising a flat single element but configured as a plurality of polygons joined to one another, one edge of one polygon to one edge of a contiguous polygon to form a pattern of repeating polygons substantially lying in a plane and extending substantially in a straight line, the length of said contact spring being greater than its width, said contact spring comprising one or multiple device contacts that extend at least from one side edge of said spring, or greater than three device contacts that extend from at least one surface of said spring, said device contacts arranged so that said spring comprises at least one device contact that abuts up against said heat spreader and at least one device contact that abuts up against said electrical substrate.

2. The process of claim 1 wherein each of said polygons have the same number of sides.

3. The process of claim 1 wherein each of said polygons have from three to about four sides.

4. The process of claim 2 wherein said polygons have from three to about four sides.

5. The process of claim 1 wherein said plane projects forwardly along its length, and then at one interval or a plurality of intervals along its length, extends upwardly for a fixed number of degrees and subsequently downwardly for about the same number of degrees to form said device contacts and said plane continues to project forwardly along its length.

6. The process of claim 5 wherein at least one of said intervals is separated by said plane that continues to project forwardly along its length.

7. The process of claim 1 wherein said plane is arced along its length to form one of said device contacts.

8. The process of claim 1 wherein said plane is dimpled to form at least one of said device contacts, said dimple conductively engaging a groove in at least one of said electrically conductive heat spreader or electrical substrate to provide a heat conductive contact and electrical contact between said article, said electrically conductive heat spreader, and said electrical substrate.

9. The process of claim 1 wherein one or both ends of said plane are angled away from said plane to form said device contacts.

10. The process of claim 9 wherein both ends of said plane are angled away from said plane in the same direction.

11. The process of claim 1 wherein said contact spring is formed to comprise a combination of different polygons arranged to provide several of said device contacts along at least one of the non-joined side edges of said polygons and functioning as said device contacts as said spring projects forward from the first of said polygons to the last of said polygons.

12. The process of claim 11 wherein said contact spring is substantially as shown in FIG. 4.

13. The process of claim 1 wherein said plane is optionally perforated.

14. A process for manufacturing a device comprising placing a contact spring in a gap between an electrically conductive heat spreader and an electrical substrate, said heat spreader positioned to remove heat from said electrical substrate, said spring being structured to both conduct heat from said substrate to said heat spreader and to electrically connect said substrate and heat spreader, said spring comprising a flat single element but configured as a plurality of polygons joined to one another, one edge of one polygon to one edge of a contiguous polygon to form a pattern of repeating polygons substantially lying in a plane that spirals around an axis fixed in space, the length of said contact spring being greater than its width, said contact spring having multiple device contacts in the body of said spring where said device contacts extend from one side edge of said spring or one surface of said spring, or both said side edge and said surface, said device contacts arranged so that at least one abuts up against said heat spreader and at least one can abut up against said electrical substrate.

15. The process of claim 14 wherein each of said polygons has the same number of sides.

16. The process of claim 14 wherein each of said polygons have from three to about four sides.

17. The process of claim 15 wherein said polygons have from three to about four sides.

18. The process of claim 14 wherein said plane projects forwardly along its length, and then at one interval or a plurality of intervals along its length, extends upwardly for a fixed number of degrees and subsequently downwardly for about the same number of degrees to form said device contacts and said plane continues to project forwardly along its length.

19. The process of claim 18 wherein at least one of said intervals is separated by said plane that continues to project forwardly along its length.

20. The process of claim 14 wherein said plane is arced along its length to form one of said device contacts.

21. The process of claim 14 wherein said plane is dimpled to form at least one of said device contacts, said dimple conductively engaging a groove in at least one of said electrically conductive heat spreader or electrical substrate to provide a heat conductive contact and electrical contact between said article, said electrically conductive heat spreader, and said electrical substrate.

22. The process of claim 14 wherein one or both ends of said plane are angled away from said plane to form said device contacts.

23. The process of claim 22 wherein both ends of said plane are angled away from said plane in the same direction.

24. The process of claim 14 wherein said plane in profile spirals around an axis fixed in space forms a tubular shape.

25. The process of claim 14 wherein said plane in profile spirals around an axis fixed in space forms a frusto-conical shape.

26. The process of claim 14 wherein said repeating polygons that extend upwardly and downwardly around said axis fixed in space have an inner edge facing said axis and an outer edge facing away from said axis, and said inner edge and said outer edge are rounded toward said axis.

27. The process of claim 14 configured as a split washer where said plane only spirals about once around said axis.

28. The process of claim 14 configured as a split washer where said plane spirals around said axis by about 340° to about 380°.

29. The process of claim 1 wherein said contact spring is positioned in an electronic device having an electronic circuit that includes EMI emitters, said electronic device also including a lid comprising a substantially juxtaposed electrically conductive heat spreader, said contact spring operatively associated with said electronic circuit to at least: (1) provide a low impedance electrical connection between said electronic circuit and said lid; (2) ground said lid to said electronic circuit; (3) minimize EMI in said electronic circuit; (4) conduct heat from said electronic circuit to said lid; or any one or combination of said features (1), (2), (3), (4).

30. The process of claim 29 where said electronic device comprises a flip chip ball grid array.

31. The process of claim 29 wherein each of said polygons has the same number of sides.

32. The process of claim 29 wherein each of said polygons has from three to about four sides.

33. The process of claim 29 wherein said polygons have from three to about four sides.

34. The process of claim 29 wherein said plane projects forwardly along its length, and then at one or a plurality of intervals along its length, extends upwardly for a fixed number of degrees and subsequently downwardly for about the same number of degrees and said plane continues to project forwardly along its length.

35. The process of claim 29 wherein at least one of said intervals is separated by said plane that continues to project forwardly along its length.

36. The process of claim 29 wherein said plane is dimpled to form at least one of said device contacts, said dimple arranged to conductively engage a groove in at least one of said electrically conductive heat spreader or electrical substrate to provide a heat conductive contact and electrical contact between said article, said heat spreader, and said electrical substrate.

37. The process of claim 29 wherein one or both ends of said plane are angled away from said plane to form said device contacts.

38. The process of claim 37 wherein both ends of said plane are angled away from said plane in the same direction.

39. The process of claim 29 wherein said plane has an arced cross section.

40. The process of claim 29 comprising a combination of different polygons arranged to provide several of said device contacts along at least one of the non-joined side edges of said polygons to act as said device contacts as said spring projects in substantially a straight line from the first of said polygons to the last of said polygons.

41. The process of claim 29 where said spring is configured substantially as shown in FIG. 4.

42. The process of claim 29 wherein said plane is optionally perforated.

* * * * *